(12) United States Patent
Leib

(10) Patent No.: US 8,420,445 B2
(45) Date of Patent: Apr. 16, 2013

(54) METHOD FOR PACKING SEMICONDUCTOR COMPONENTS AND PRODUCT PRODUCED ACCORDING TO THE METHOD

(75) Inventor: Juergen Leib, Neukirchen am Brand (DE)

(73) Assignee: Wafer-Level Packaging Portfolio LLC, Cupertino, CA (US)

( * ) Notice: Subject to any disclaimer, the term of this patent is extended or adjusted under 35 U.S.C. 154(b) by 429 days.

(21) Appl. No.: 12/667,185

(22) PCT Filed: Jun. 4, 2008

(86) PCT No.: PCT/EP2008/004467
§ 371 (c)(1),
(2), (4) Date: Jul. 20, 2010

(87) PCT Pub. No.: WO2009/003565
PCT Pub. Date: Jan. 8, 2009

(65) Prior Publication Data
US 2010/0283127 A1    Nov. 11, 2010

(30) Foreign Application Priority Data
Jun. 29, 2007    (DE) .......................... 10 2007 030 284

(51) Int. Cl.
*H01L 21/78* (2006.01)
(52) U.S. Cl.
USPC .................... 438/113; 438/462; 257/E21.599
(58) Field of Classification Search .................. 438/113, 438/114, 458, 462, 465
See application file for complete search history.

(56) References Cited

U.S. PATENT DOCUMENTS

| 6,036,872 A | 3/2000 | Wood et al. |
| 7,679,167 B2 * | 3/2010 | Chen et al. ..................... 257/659 |
| 2001/0044194 A1 | 11/2001 | Hara |
| 2004/0183185 A1 | 9/2004 | Badihi |
| 2005/0208735 A1 * | 9/2005 | Noma et al. .................. 438/460 |
| 2007/0087524 A1 * | 4/2007 | Montgomery ................ 438/427 |
| 2007/0096311 A1 | 5/2007 | Humpston et al. |
| 2007/0190691 A1 | 8/2007 | Humpston et al. |

FOREIGN PATENT DOCUMENTS

| WO | WO02103784 | 12/2002 |
| WO | WO2004044980 | 5/2004 |

OTHER PUBLICATIONS

"Vacuum packaging for microsensors by glass-silicon anodic bonding", Henmi, H. et al., Sensors and Actuators A, 43, 1994, pp. 243-248.
International Search Report and Written Opinion corresponding to International application No. PCT/EP2008/004467 dated Sep. 18, 2008.

(Continued)

Primary Examiner — Wensing Kuo
(74) Attorney, Agent, or Firm — Edward P. Heller, III

(57) ABSTRACT

A method for packing semiconductor components is provided, in which a first side of a first wafer is connected to at least one further wafer, wherein at least one of the wafers has a plurality a semiconductor circuits and wherein trenches are made in the second side of the first wafer opposite to the first side and divide the first wafer into a plurality of parts, which are separated from one another by the trenches, but are connected mechanically to one another by means of the at least one further wafer, and wherein the connecting region between the first wafer and the at least one further wafer has been or will be laterally exposed in the trenches. A coating that covers the connecting region is then applied to the regions of the trenches in which the connecting region is exposed.

5 Claims, 11 Drawing Sheets

OTHER PUBLICATIONS

Figure 1:
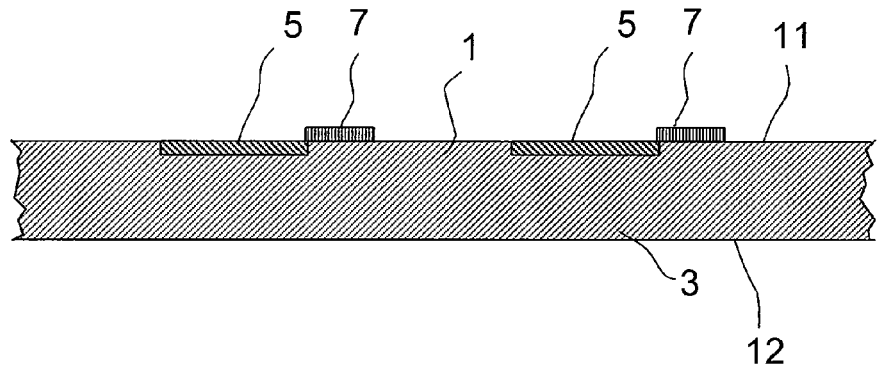

Hemi, H. et al., "Vacuum packaging for microsensors by glass-silicon anodic bonding," Fac. of Eng., Tohoku Univ., Sendai, Japan, May 1994 (abstract only).

English Translation of International Preliminary Report corresponding to International application No. PCT/EP2008/004467 dated Apr. 8, 2010.

* cited by examiner

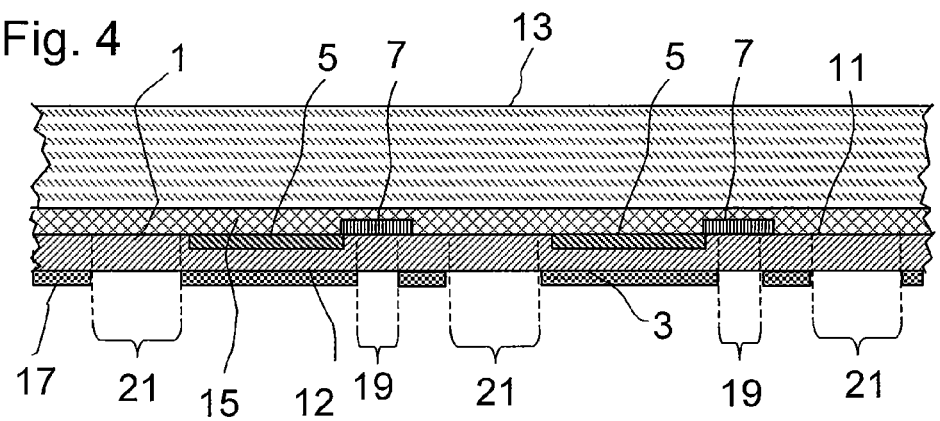
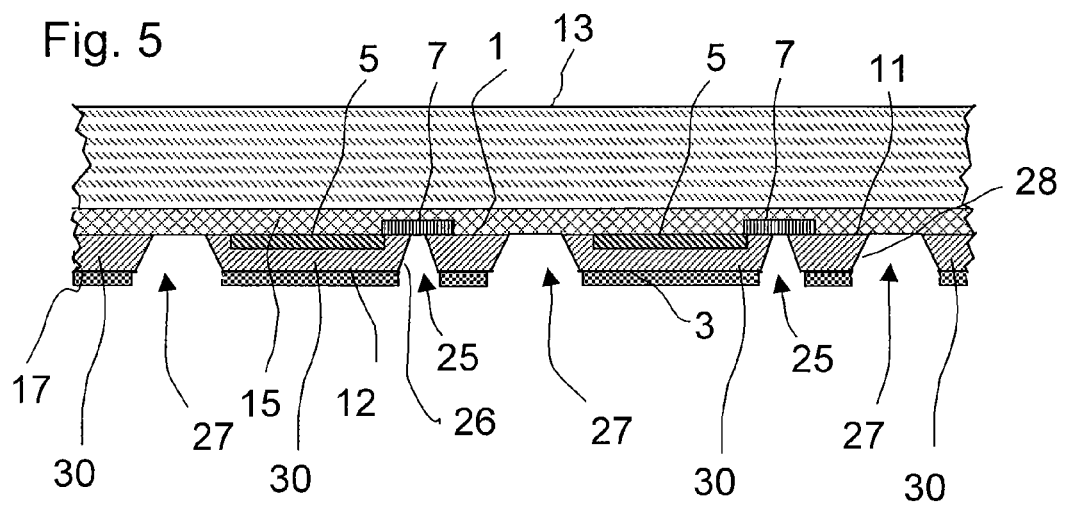

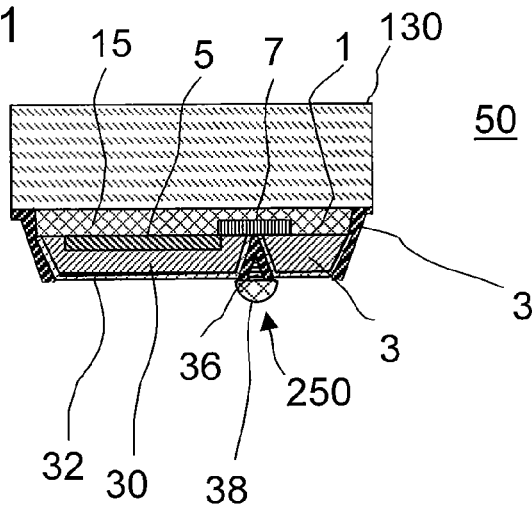
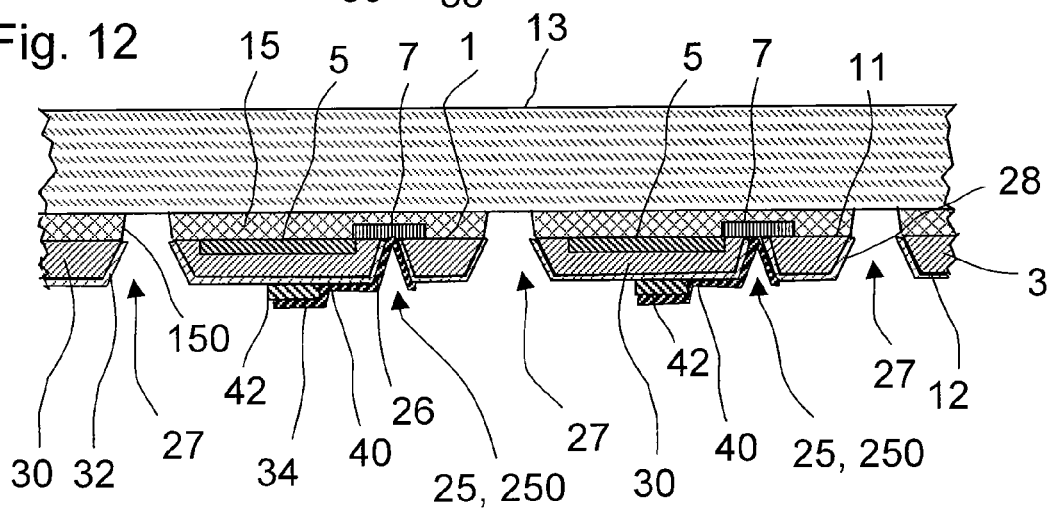
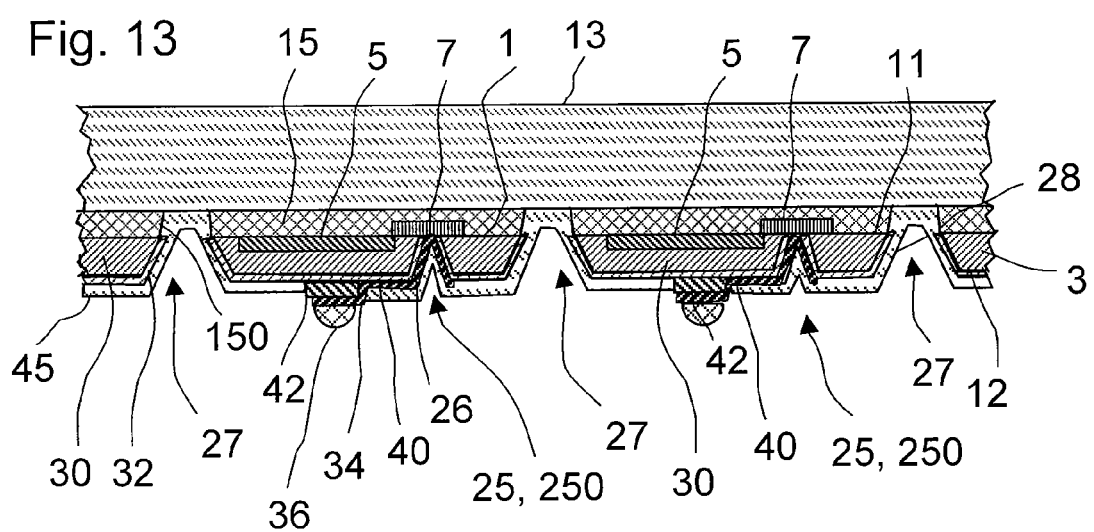

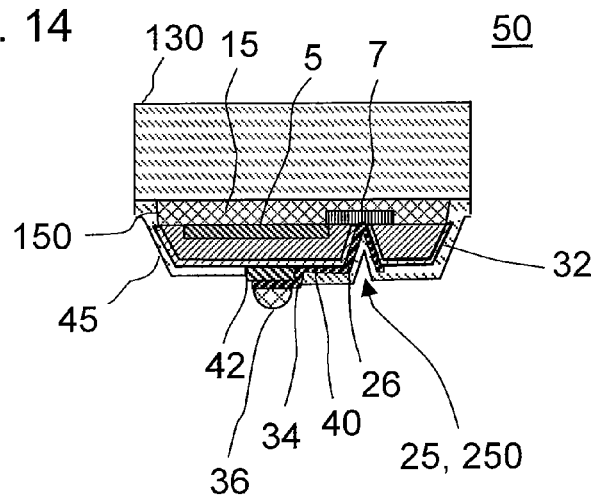
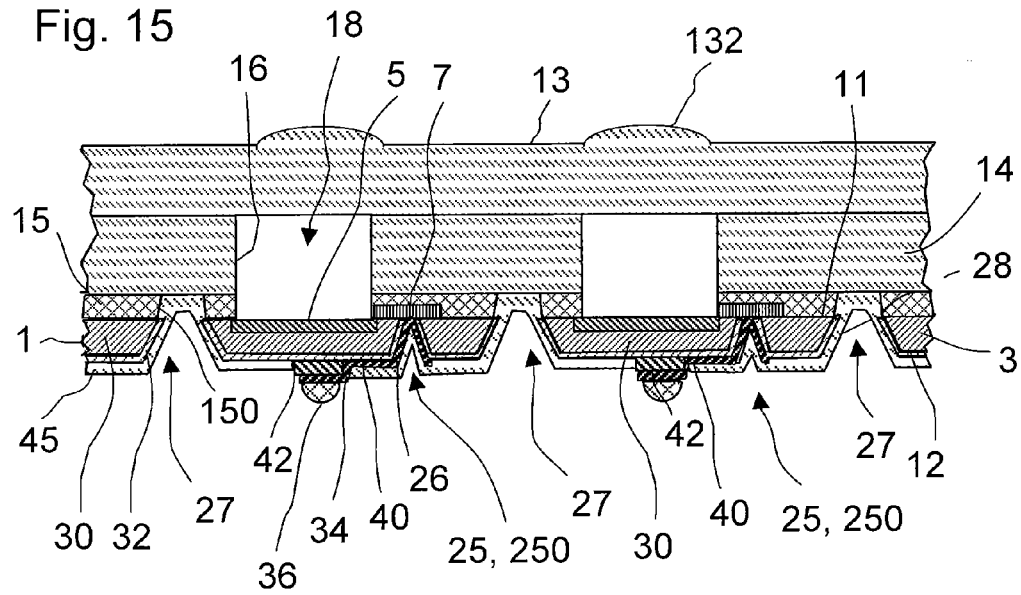

METHOD FOR PACKING SEMICONDUCTOR COMPONENTS AND PRODUCT PRODUCED ACCORDING TO THE METHOD

The invention relates, in general, to the packing of semiconductor components, in particular the packing of semiconductor components on a wafer surface.

The packing of semiconductor components, such as, for instance, integrated circuits, is widely carried out on wafer surfaces. This means that a plurality of semiconductor elements are already combined in a wafer composite while a complete or at least partial packing or encapsulation is carried out. After the packing or encapsulation, the individual components are then separated out of the wafer. In this process, plastics are also often employed during the encapsulation. For example, a plastic adhesive can be used for connecting a semiconductor wafer containing the semiconductor components with a covering or support wafer, which covers and encapsulates the active side of the component. Likewise, a plurality of semiconductor wafers containing semiconductor circuits can be stacked on one another using adhesive layers in order to create three-dimensional, or multilayer, integrated circuits.

Even when the covering wafer can effect a hermetic encapsulation that has long-term stability on account of its material properties, though, the problem here lies in the fact that, at latest after separation of the individual components from the wafer stack, the adhesive layer is exposed laterally. However, organic plastics, in comparison with the inorganic materials otherwise employed in manufacture, have the property that they are appreciably more permeable to gases and moisture. As a result, over the course of time, moisture, for example, can penetrate along the adhesive layer between the covering substrate and the semiconductor components and impair the properties of the semiconductor component. The mechanical properties of the composite, such as, in particular the adhesive strength of the adhesive layer, may also be influenced negatively by penetrating substances. Thus, the adhesive used may swell due to penetrating moisture.

Furthermore, cavities, which surround the electronic semiconductor circuits, are also employed during the packing of components. Such cavities may serve, for example, for mechanical decoupling of the covering substrate and the circuit and thereby improve the mechanical protection of the circuits. A protective gas can be enclosed in such cavities. In the case of permeable adhesion, not only can moisture penetrate into the cavity in this case, but it is especially also possible that the enclosed gases escape to the outside along the adhesion over the course of time. If moisture penetrates into the cavity, it can condense there and impair the performance and/or function of the component. Thus, in the case of image sensors, the image quality can be degraded or the resonance frequency of gyroscopes impaired. Finally, penetrating moisture can also lead to corrosion or other undesired reactions.

Accordingly, the invention is based on the problem of improving the packing of semiconductor components on a wafer surface. This problem is already solved in a surprisingly simple way by the subject of the independent claims. Advantageous embodiments and further developments of the invention are presented in the dependent claims.

In accordance therewith, the invention provides a method for packing semiconductor components, in which a first side of a first wafer is connected to at least one further wafer, wherein at least one of the wafers has a plurality a semiconductor circuits and wherein trenches are made in the second side of the first wafer opposite to the first side and divide the first wafer into a plurality of parts, which are separated from one another by the trenches, but are connected mechanically to one another by means of the at least one further wafer, and wherein the connecting region between the first wafer and the at least one further wafer has been or will be laterally exposed in the trenches, wherein a coating that covers the connecting region is applied to the regions of the trenches in which the connecting region is exposed.

Obtained in this way is a corresponding intermediate for producing packed semiconductor components in which a first side of a first wafer is connected to a first side of at least one further wafer at a connecting region, wherein at least one of the wafers has a plurality of semiconductor circuits and wherein trenches are made in the second side of the first wafer opposite to the first side and divide the first wafer into a plurality of parts, which are separated from one another by the trenches, but are mechanically connected to one another by means of the at least one further wafer, and wherein the connecting region between the first wafer and the second wafer is laterally exposed in the trenches, wherein a coating that covers the connecting region is arranged in the regions of the trenches in which the connecting region is exposed.

Accordingly, the selective application of a barrier coating to the connecting region between the two wafers makes possible, in general, also a higher flexibility in the choice of the materials used.

In this case, the first side of the first wafer is preferably the active side of a semiconductor wafer containing semiconductor circuits, that is, the side of the wafer on which the circuits of the components are located.

In general, the trenches are made after connection. However, it is also possible to fix the first wafer in place on a further substrate and then to make the trenches and then the connect the parts of the first wafer that are connected to one another by means of the further wafer, but are separated by trenches, preferably by means of a connecting layer. The further wafer can be a constituent part of the wafer composite from which the components are separated out. However, this further wafer can also serve as a transfer support, which, after the first wafer, or the parts produced from it, has been fixed in place, is removed from the second wafer.

For many cases of application, the coating is made particularly preferably in the trenches, with other regions of the second side of the first wafer being accordingly left exposed and the laterally exposed connecting region being covered.

Particularly preferably, a material for connecting the two wafers is employed, so that a connecting layer is formed. However, the invention can also be applied to a direct connection of the two wafers. For example, wafers can by means of anodic bonding or a direct connection due to pressing of the activated surfaces together. In these cases, although no pronounced connecting layer is formed, it can happen that even a direct connection is not hermetic, so that moisture, for example, can penetrate between the wafers.

Coming into consideration as a connecting layer is, in particular, a plastic layer or an organic adhesive or an adhesive layer. It has been found, however, that particular advantages are obtained for a connection by means of a sol-gel layer. Sol-gel layers already have a very low permeability, although even these layers can swell under the influence of moisture or be attacked under the action of bases. Furthermore, inorganic porous connecting layers, which can be produced, in particular, by means of a sol-gel process, also have a high permeability. Such connecting layers, which can be employed for thermal decoupling of the bound substrates, for example, can also be insulated according to the invention and thus the semiconductor circuits can be better protected. Further possible is also a connection of the wafers by means of alloy solders. In this case, a coating in the trenches in accordance with the invention can provide protection against, among other things, corrosion.

Besides semiconductor wafers containing electronic or optoelectronic circuits, it is possible according to the invention to pack, alternatively or additionally, wafers that have micro-electromechanical components.

The trenches are, in particular, linear depressions along which, later, the elements can be separated from the composite containing the at least one further wafer by separation along the trenches. Accordingly, the trenches run along the separating regions provided, which are also known as "dicing streets" in the field of semiconductor manufacture. Semiconductor elements that can be produced by means of division by separating along the trenches of the intermediate product according to the invention are accordingly characterized by a layer on the sides of the semiconductor substrate containing the circuits that covers the connecting region at the transition between the covering substrate and the semiconductor substrate.

The covering can take place using an inorganic coating. Such layers have, in general, a particularly low permeability. Besides such inorganic coatings, it is also possible to employ, alternatively or additionally, organic materials, in particular polymers. A further development of the invention therefore provides that the covering of the laterally exposed connecting region include the application of an organic coating, in particular a polymeric layer. Thus, for example, an adhesive layer as connecting layer can be covered with another polymer laterally in the trenches in order to increase the stability of the components. Epoxide resin is often employed for connecting substrates for packing of components. Although this plastic has a very high adhesive strength, it is hygroscopic to a certain degree and can swell under the influence of moisture. This can also be accompanied by, among other things, a decrease in the adhesive strength. In order to effect an improved stability of the components, it is also possible to apply another polymer, preferably selectively by way of the connecting parts that have been exposed or that are exposed, in order to prevent the penetration of moisture or at least to retard it.

Suitable polymers having a good barrier effect for the use as covering of the coating layer that has been exposed or that is exposed according to the invention are, among others, BCB (bisbenzocyclobutenes) or PI (polyimide). Further possible are also plastics that can be deposited in vacuum coating processes or from the gas phase. Thus, a covering with, for example, parylene or with a coating that contains fluorinated hydrocarbons, such as PTFE (polytetrafluoroethylene), can take place. Coatings with fluorinated hydrocarbons can be produced, for example, in chemical vapor-phase deposition from a $SF_6$-containing plasma.

According to a particularly preferred embodiment of the invention, the first wafer is thinned on the second side after the connection, such as, for example, after the adhesion to the least one further wafer. In this case, the further wafer serves not only for packing, but, at the same time, also as a support for the first wafer. The composite of the first and the at least one second wafer ensures an adequate mechanical stability for the thinning.

In this case, it is advantageous when the application of the coating that laterally covers the connecting region in the trenches takes place after the thinning. Particularly preferably, the trenches can also be made after the thinning. In this way, the depth of the trenches can be correspondingly reduced when they are made.

According to one embodiment of the invention, a dielectric layer for lateral covering of the connecting region, such as, for instance, the adhesive layer, is deposited. For example, a glass layer can be vapor-deposited for this purpose.

As vacuum-evaporated glass for laterally encapsulating the adhesive layer, it is possible, in general, to use borosilicate glasses, in particular glasses that have the following compositional ranges in weight percent:

| Components | Glass range 1 | Glass range 2 |
|---|---|---|
| $SiO_2$ | 75-85 | 65-75 |
| $B_2O_3$ | 10-15 | 20-30 |
| $Na_2O$ | 1-5 | 0.1-1 |
| $Li_2O$ | 0.1-1 | 0.1-1 |
| $K_2O$ | 0.1-1 | 0.5-5 |
| $Al_2O_3$ | 1-5 | 0.5-5 |

Preferred vacuum-evaporated glasses from these groups are glasses of the Schott company that have the following composition in weight percent:

| Components | Glass 1 | Glass 2 |
|---|---|---|
| $SiO_2$ | 84.1% | 71% |
| $B_2O_3$ | 11.0% | 26% |
| $Na_2O$ | ≈2.0% | 0.5% |
| $Li_2O$ | ≈0.3% | 0.5% |
| $K_2O$ | ≈0.3% | 1.0% |
| $Al_2O_3$ | 0.5% | 1.0% |

The preferably used glasses have, in particular, the properties listed in the table below:

| Properties | Glass 1 | Glass 2 |
|---|---|---|
| Linear temperature expansion coefficient $\alpha_{20-300}$ $[10^{-6} K^{-1}]$ | 2.75 | 3.2 |
| Density (g/cm$^3$) | 2.201 | 2.12 |
| Transformation point [° C.] | 562° C. | 466° C. |
| Index of refraction | $n_D = 1.469$ | 1.465 |
| Hydrolytic resistance class according to ISO 719 | 1 | 2 |
| Acid resistance class according to DIN 12 116 | 1 | 2 |
| Alkali resistance class according to DIN 52322 | 2 | 3 |
| Dielectric constant ε (25° C.) | 4.7 (1 MHz) | 3.9 (40 GHz) |
| tan δ (25° C.) | $45 \times 10^{-4}$ (1 MHz) | $26 \times 10^{-4}$ (40 GHz) |

Likewise, alternatively or additionally, the deposition of this dielectric layer on the trenches is possible by means of chemical vapor-phase deposition, preferably by means of plasma-assisted, particularly plasma-pulse-induced chemical vapor-phase deposition. For example, in this way, it is possible to deposit a silicon oxide layers by igniting a plasma above the surface to be coated in a gas atmosphere containing a silicon compound. Suitable silicon compounds for this are, for example, hexamethyldisiloxane (HMDSO), tetraethoxysilane (TEOS), silane, or silicon chloride. Also possible for covering is the deposition of nitrides by means of plasma-assisted chemical vapor-phase deposition.

According to another embodiment of the invention, which can also be combined with the deposition of a dielectric layer, a metallic layer is applied to the trenches for covering the connecting region.

The number of required process steps can be reduced in an advantageous manner when the application of the inorganic layer is carried out together with the deposition of another functional coating, for example, when a functional coating is used simultaneously as a lateral covering for the connecting region in the trenches. Thus, together with the deposition of a metallic layer for covering, simultaneously a metallization takes place to produce electrical contacts of the components. If a dielectric layer, such as, for example, a glass layer, is deposited by vacuum evaporation or an oxide layer is deposited by means of plasma-assisted chemical vapor-phase deposition as covering, this step can, in accordance with another, alternative or additional further development of the invention, serve to deposit simultaneously an electrically insulating layer on the second side. This insulating layer can serve, for example, to insulate electrical contacts or leads. In this case, depending on the arrangement, the insulating layer can be applied to an electrically conducting structure or the electrically conducting structure can be applied to the insulating layer. It is also possible, alternatively or additionally, to deposit a passivating layer.

As a result of the simultaneous production of the covering for the connecting region, such as, in particular, an adhesive layer, or else an inorganic sol-gel layer and another functional layer by deposition of a coating according to the two embodiments of the invention described above, the covering matches the simultaneously deposited further functional layer in terms of its structure. This can also relate to the chemical composition of the layer as well as to the morphology thereof. Accordingly, a metallic layer matches in terms of its structure the lateral covering of the connecting region when metallicized regions are applied simultaneously to produce electrical contacts of the circuits of components. If, on the other hand, a dielectric layer is applied simultaneously with an insulating layer for lateral covering of the connecting region, they correspond in terms of their structure to an insulating layer arranged on the second side of the first wafer for insulating electrical contacts.

This matching in terms of structure to another functional layer does not relate necessarily to the layer thickness, however. If, for example, one layer, whether a metallic layer or a dielectric layer, is deposited by vacuum evaporation, then the layer thickness obviously depends on the angle of the vaporizing source to the coated surface.

According to a particularly preferred embodiment of the invention, when a connecting layer is used, such as, in particular, an adhesive layer, it is removed in the trenches that are made, preferably in their bottom region, at least partially prior to the application of the coating, so that the connecting layer in the bottom region of the trenches that are made is absent at least partially. As a result, a lateral covering of the transition between the two connected substrates is made possible. Otherwise, after separation of the composite, the connecting layer would be laterally exposed once again.

Another, alternative or additional possibility for laterally exposing the connecting layer in the trenches consists in applying the connecting layer in a laterally structured manner by creation of recessed regions in which the trenches are made. As a result, the connecting layer, such as, preferably, an adhesive layer, is absent—at least in part—a priori within the regions in which the trenches are made.

The invention is particularly suitable in connection with a back-side contacting of semiconductor elements. In this case, electrical contacts are produced on the back side, or the second side, of the wafer substrate for connection of semiconductor elements and are connected with electrical contact junctions on the first side. In order to effect this, it is provided according to another embodiment of the invention that, in the first wafer, conducting vias, or conducting channels, are made through the substrate of the first wafer and run transverse to the connected side of the wafer, particularly perpendicular to the connected side of the wafer.

Preferably, to this end, holes are made in the substrate of the first wafer, in which, then, in order to produce a conducting connection to a contact on the opposite side, a conducting material is introduced. In this case, it is particularly advantageous when the trenches and holes are made in the substrate of the first wafer in a joint process step. Preferably, a joint etching process can be employed to make the holes and/or trenches, with both plasma etching and also etching by means of an appropriate etching solution coming into consideration. Likewise coming into consideration are mechanical removal processes, such as grinding. Further possible is also the making of trenches by local removal of material by means of intense laser irradiation. Such a laser ablation can be, in particular, a laser vaporization of the substrate material. The making of trenches can take place particularly advantageously in such a manner that the trenches have inclined side walls.

Such a cross-sectional form, such as, for example, a trapezoidal cross section, is advantageous in order to apply, for example, subsequent coatings, such as, in particular, the lateral covering of the adhesive layer. The same holds true in a corresponding manner also for the holes for contacting of the circuits. It is easier to produce coatings with an oriented deposition, such as, for instance, during vacuum evaporation or sputtering, on the inclined walls, because shadowing of the side walls of the trenches and/or holes with respect to the coating source is prevented in this way.

It is further particularly preferred that the trenches and/or holes are made from the second side of the substrate of the first wafer, particularly in an already thinned substrate. In order to produce the contact, it is preferred, particularly in the case of the variant in which the holes are made from the second side of the substrate, that the holes directly abut the contact junctions on the first side of the first wafer, or on the substrate of this wafer, so that the electrical contact junctions form the bottom of the holes or at least a bottom region.

The invention is suited particularly also for the packing of optoelectronic components. In order to pack such semiconductor components, it is further appropriate when one of the wafers, preferably the second wafer, is a glass wafer. In such a composite, the second wafer or a further wafer that is connected directly or indirectly to it, in addition to its property as encapsulation and possible stabilization, serves, also generally, as a window for the input or output of light that is to be detected or emitted.

The invention is based on the concept of selectively closing undesired diffusion channels at the connecting site between two wafers by deposition of coating material. In a further development of the underlying idea, however, gas-permeable connections may be fundamentally desired during a part of the process steps for the packing of semiconductor components on wafer surfaces. This relates, in particular, to the packing of semiconductor wafers, the wafer composite of which has cavities. Here, it has proven to be particularly advantageous when a gas-permeable connection is kept open during some of the process steps and then is closed, in particular by selective application of coating material, in order to seal the cavity hermetically.

Another aspect of the invention therefore provides also for a method for packing of components on a wafer surface, in particular according to the processes described above, in which a first wafer is connected to a second wafer, wherein at least one of the wafers has a plurality of electronic, optoelectronic, and/or micro-electromechanical components, wherein, during the connection of two wafers, cavities that surround the components at least in part are created and wherein the cavities communicate with the surrounding via gas-conducting channels and the gas-conducting channels are closed by application of a coating.

As a result, an intermediate product for the production of packed semiconductor components is obtained, in which a first wafer is connected to a second wafer, wherein at least one of the wafers has a plurality of electronic, optoelectronic, and/or micro-electromechanical components, wherein, during the connection of two wafers, cavities that surround the components at least in part are created and wherein the cavities communicate with the surrounding via gas-conducting channels and the gas-conducting channels are closed by application of a coating. This intermediate product can further advantageously have also the features of the above-described intermediate products with covered connecting region.

This embodiment of the invention makes it possible, for example, to carry out vacuum coating steps on the already connected wafers, without it being possible for a great pressure difference to build up on account of the gas enclosed in the cavity. On the other hand, evacuated cavities can produced as well in vacuum by application of the coating that covers the channels.

The method according to this embodiment can be carried out quite similarly to the above-described method for packing of the laterally exposed connecting region of the two wafers when channels that open laterally into the trenches and extend preferably along the connecting region of the wafer are created. In accordance therewith, further development of the invention, a first side of a first wafer is connected to at least one further wafer, wherein at least one of the wafers has a plurality of active elements, in particular semiconductor circuits, and wherein trenches are made in the second side of the first wafer opposite to the first side and divide the first wafer into a plurality of parts, which are separated from one another by the trenches, but are connected mechanically to one another by means of the at least one further wafer, and wherein at least one of the wafers has depressions extending along the surface on the side with which it is connected to the further wafer, these depressions forming cavities along the connecting region after the connection of the wafers, and wherein the connecting region between the first and second wafer has been or will be laterally exposed in the trenches, so that the channels open laterally into the trenches. It is then possible to apply a coating to the regions of the trenches in which the connecting region will be or is exposed, this coating covering the channels and thus closing them. In this case, the connecting region can also obviously be closed as well once again simultaneously and thereby encapsulated. The corresponding intermediate product accordingly has channels that start from the cavities and run along the connecting region and open into the trenches and that are closed in the trenches by a coating, preferably, once again, a selectively applied coating in the trenches.

Alternatively to introducing the channels into the wafers themselves, it is also further possible to introduce the depressions on a layer on the wafer. Thus, the wafers can be also be connected, for example, by means of an appropriate connecting layer in which the channels are made.

According to another, alternative or additional further development of this embodiment of the invention, channels are made through the substrate of the wafer in at least one of the wafers, these channels running transverse to the connecting surface region and connecting the cavity with the surrounding. The channels can then later be covered and insulated with the coating. Accordingly, the channels in an intermediate product produced in this way run from the outer side of one of the wafers through the substrate to the side connected to the other wafer and open there into the cavity.

In the above-described embodiment of the invention, in which channels to cavities are covered by means of a coating, all the coating materials and coating steps otherwise employed for the coating of the connecting region between the wafers can also be employed. Preferably, during closing of the cavities by the coating, a controlled atmosphere is enclosed in the cavities.

The invention will be described in more detail below on the basis of embodiment examples and with reference to the attached drawings, in which the same reference signs refer to identical or similar parts.

Figure 6:
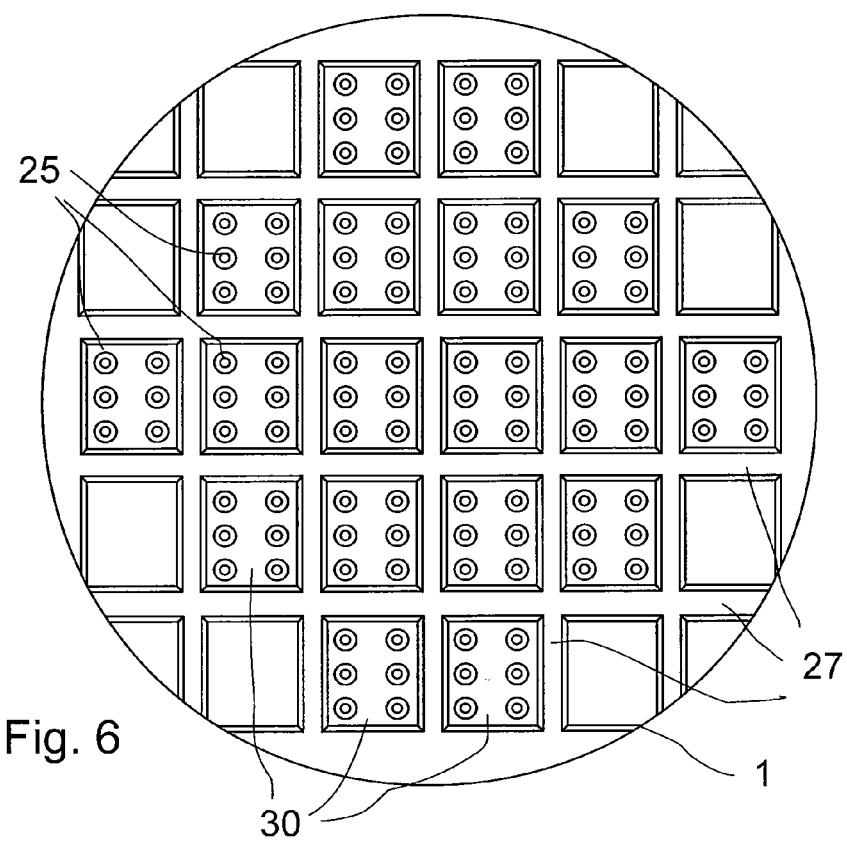
Figure 7:
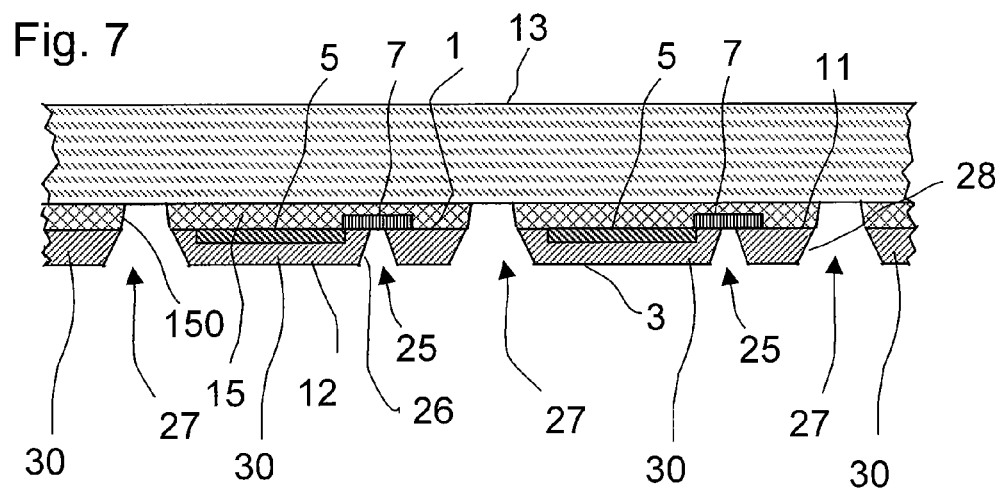
Figure 8:
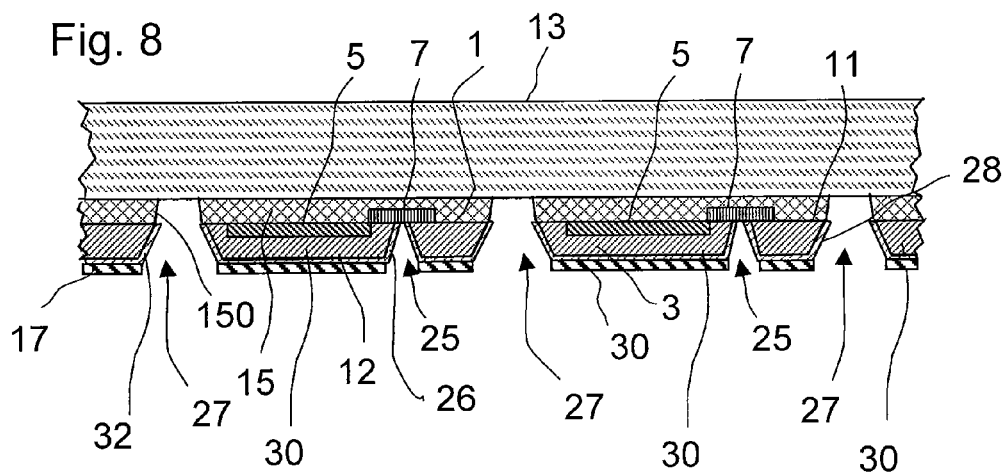
Figure 9:
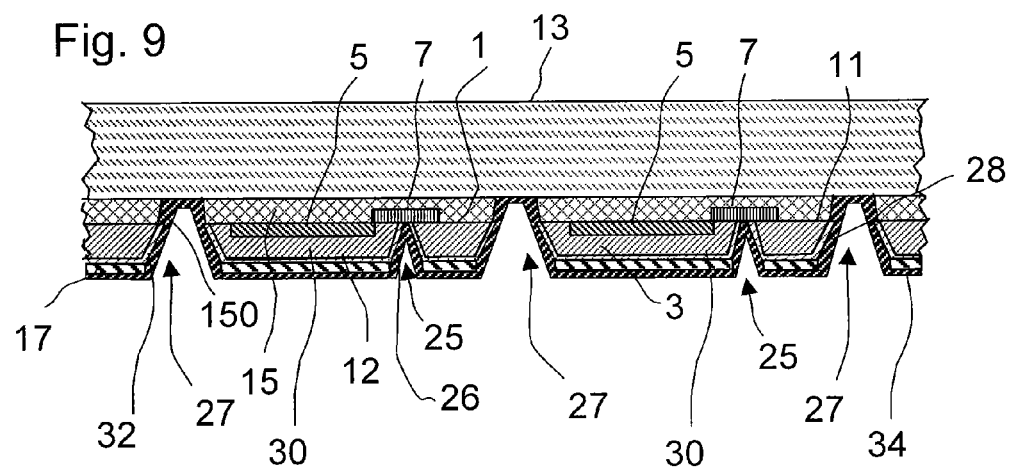
Figure 10:
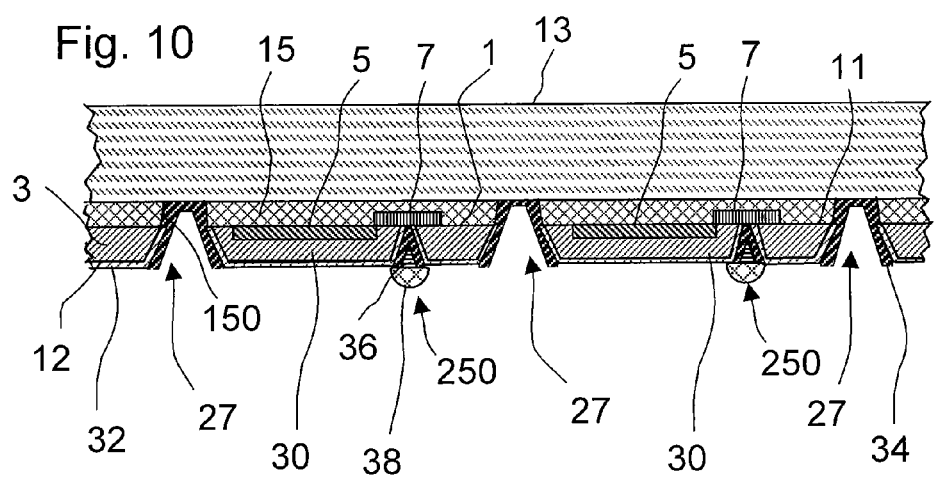

Shown are:

FIGS. 1 to 7 first process steps for producing a wafer composite intermediate product with encapsulated adhesive layer, FIGS. 8 to 10 further process steps for producing a wafer composite intermediate product according to the first variant, FIG. 11 an electronic component produced by separation from the embodiment example of an intermediate product shown in FIG. 10, FIGS. 12 and 13 further process steps for producing a wafer composite intermediate product according to a second variant, FIG. 14 an electronic component produced by separation from the embodiment example of an intermediate product shown in FIG. 10, and FIG. 15 a further development of the embodiment example of an intermediate product shown in FIG. 13.

Figure 20:
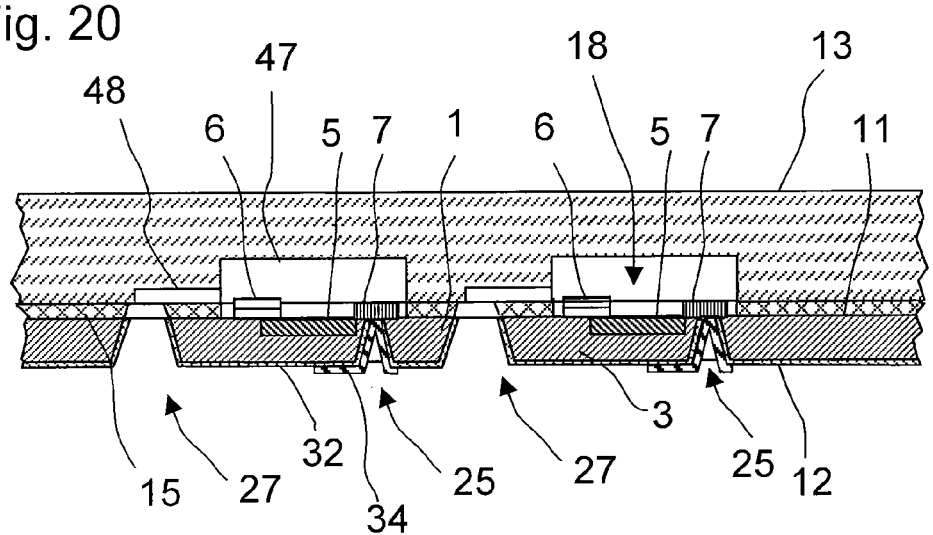
Figure 21:
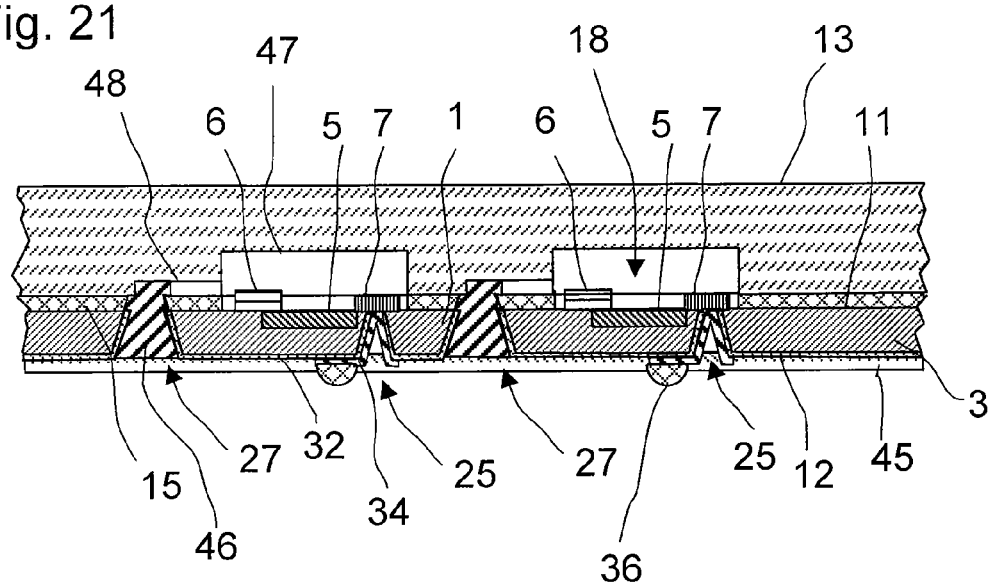
Figure 22:
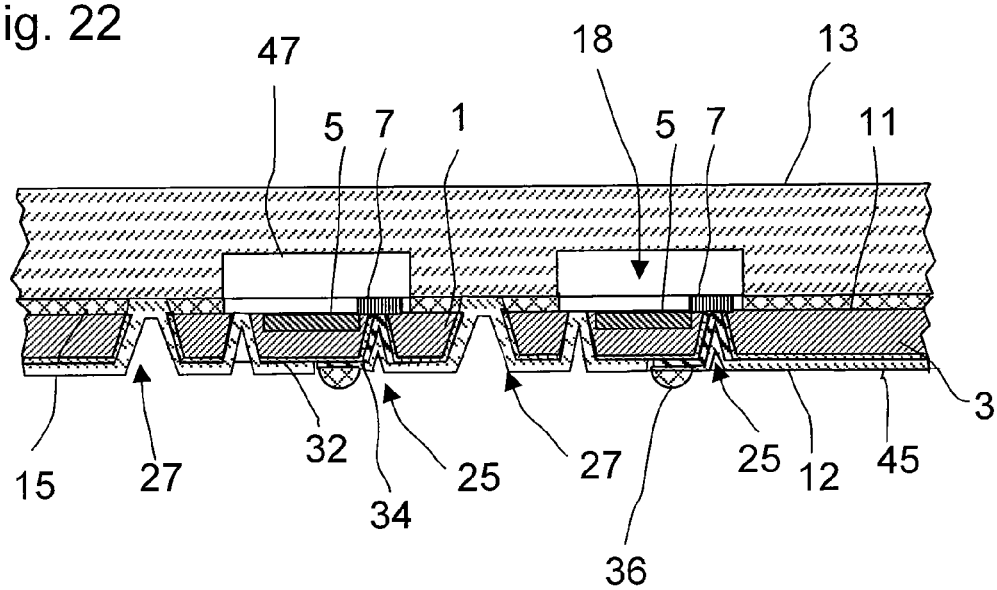

FIGS. 16 to 21 on the basis of schematic cross-sectional views and views of process steps according to a further embodiment of the invention, in which cavities of a wafer composite communicate via channels with the surrounding and the channels are closed for hermetic encapsulation of the cavities, FIG. 22 a wafer composite according to a variant of the embodiment example shown in FIG. 21, and FIGS. 23 to 26 a variant of the process steps, in which trenches are made prior to the connecting of two wafers.

The packing of semiconductor components on the wafer level, or in the wafer composite, which is followed by further process steps for producing an intermediate product containing trenches for a subsequent separation of the semiconductor components, will be described below on the basis of FIG. 1 to FIG. 7.

To this end, FIG. 1 shows, in cross section, a first wafer with sides 11, 12 and a plurality of semiconductor circuits 5. These circuits 5 were manufactured by semiconductor fabrication technique on and/or in the substrate 3 on the first side 11. Such circuits can be, for example, optoelectronic circuits of a CCD or CMOS sensor, in particular also an image sensor. In the section of the wafer 1 shown, two such circuits are illustrated. The semiconductor circuits 5 are each connected with the electrical contact junctions 7 arranged on the first side 11, via which, during operation, the voltage supply, the signal feed, and the signal tapping take place, for example. For simplicity, only one contact junction 7 is illustrated for each of the semiconductor components 5.

Figure 2:
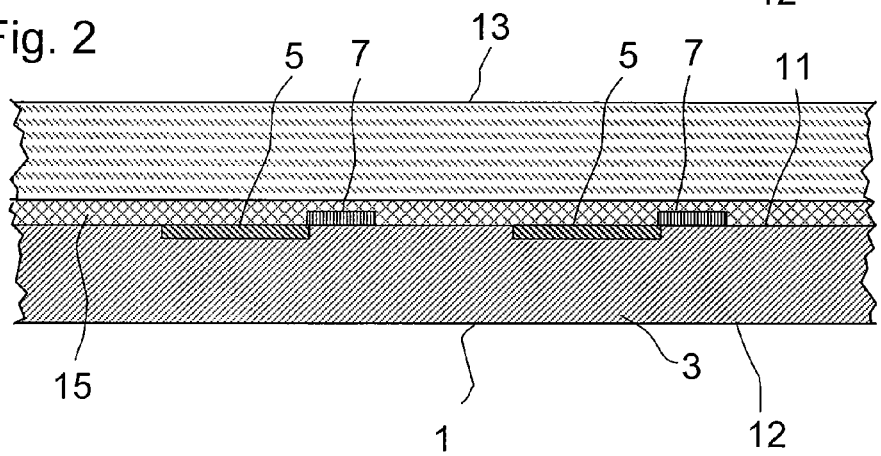

The wafer 1 is now connected, as illustrated in FIG. 2, with its first side 11 to a second wafer 13 by means of a connecting layer in the form of an adhesive layer 15 for encapsulation of the semiconductor circuits 5. Instead of an adhesive layer 13, a sol-gel layer can also be employed, for example. The second wafer 13 is a glass wafer in this embodiment example. Glass is not only an encapsulation material having very low permeability, but it is also transparent and can thus serve simultaneously as a window for optoelectronic circuits of the semiconductor circuits 5.

Figure 3:
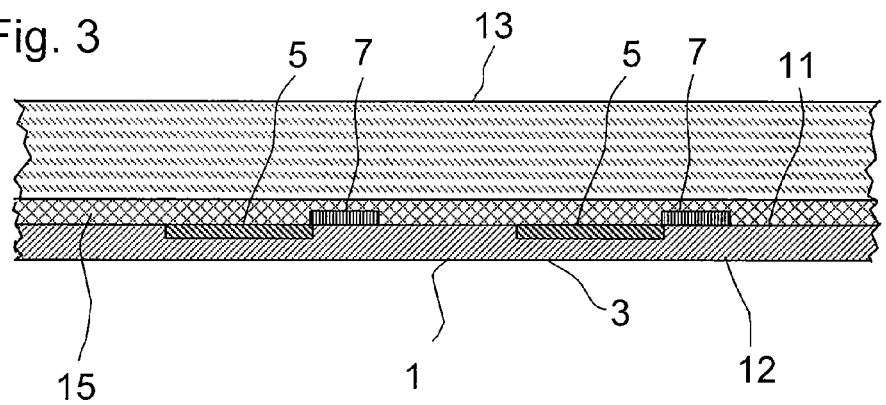

The first wafer 1, after adhesive connection, is thinned on the second side 12, as illustrated in FIG. 3. On account of the prior adhesive connection to the further wafer 13, the wafer 1 is adequately stable to withstand a thinning of the substrate 3 without fracture or damage. Depending on the use, a thinning to 300 µm or less can take place. A thinning, starting, for example, from a conventional thickness of about 0.5 millimeters, to thicknesses in the range of 180 to 80 micrometers is accomplished, on account of the support by the further wafer 13, generally without damage. Still smaller thicknesses of, for example, down to at most 40 micrometers even to 10 micrometers can be attained by thinning of the wafer. The step of thinning is of advantage, in particular, for the following steps of back-side contacting and the making of trenches in the intended separating region.

The second side 12 of the thinned substrate, as illustrated schematically in FIG. 4, is coated with a mask 17. This mask is preferably structured by photolithography. For example, the mask can be a photoresist layer, the structuring of which takes place in a known way by appropriate exposure and development. In this case, the mask is so structured that the side 12 lies exposed at linear separating regions 21 and regions 19 for the insertion of electrically conducting channels to the side 12. In this case, the exposed regions 19 are arranged opposite the contact junctions 7.

In a subsequent step, the wafer 1 is subjected to an etching procedure on the side 12, in which substrate material is removed in the openly exposed regions 19, 21 by the etching. This can take place, for example, by wet etching or by plasma etching. The result is illustrated in FIG. 5.

As a result, trenches 27 are made along the separating region 21, which divide the first wafer 1 into a plurality of parts 30, which are separated from one another by the trenches 27, but are mechanically connected to one another by means of at least one further wafer 13. In addition, holes 25 through the thinned substrate 1 are formed by the etching. In this case, these holes 25 directly abut the contact junction 7 on the first side 11 of the first wafer 1. Accordingly, the contact junctions 7 form the bottom of these holes 25. After the etching, the mask 17 can then be removed. Preferably, both the holes 25 and the trenches 27 are made in a joint etching step. In this case, it is further preferred to employ an etching process that, as illustrated schematically in FIG. 5, creates the holes 25 and the trenches 27 with inclined side walls 26 and 28, respectively.

FIG. 6 shows schematically a plan view of the side 12 of the wafer composite treated in this way. In the example shown in FIG. 6, the parts 30, which will later be separated to produce the electronic components, each have, by way of example, six holes 25 for producing electrically conducting channels than run transversely through the substrate 3. However, an actual wafer composite, in contrast to the schematic illustration of FIG. 6, will have an appreciably greater number of parts 30, or separating trenches 27, depending on the size of the wafer and the electronic components produced on it. The trenches 27 run linearly from edge to edge in order to facilitate the later separation of the components by using, for example, a saw.

Subsequently, as illustrated in FIG. 7, the adhesive layer 15 is removed in the bottom region of the trenches 27 that have been made, so that the adhesive layer 15 is laterally accessible in a region 150 of the walls of the trenches 27. Moreover, in this case, the bottom region of the side of the wafer 13 that was previously covered with the adhesive layer 15 and is adhesively connected to the first wafer 1 is correspondingly exposed. The removal of the adhesive layer 15 in the bottom region of the trenches 27 can take plane, in general, by use of an appropriate solvent, by a plasma treatment, or else by ablation by means of a laser, for example.

On the basis of FIGS. 8 and 10, a first variant for producing an intermediate product containing packed semiconductor components packed in the wafer composite will be described below starting from the manufacturing stage shown in FIG. 7. After, as shown in FIG. 7, the adhesive layer in the bottom region of the trenches 27 was removed, the second side 12 of the first wafer 1, as illustrated in FIG. 8, can be furnished with a passivating and/or insulating layer 32. This can take place, for example, by oxidation of the substrate material on the surface of the side 12 of the first wafer 1, preferably, though, by deposition of a layer, such as, for instance, an oxide layer. The preferred method in this case is chemical vapor-phase deposition, in particular plasma-assisted chemical vapor-phase deposition. The side 12 continues to be furnished with a mask 17. The mask 17, preferably, once again, a photolithographically structured photoresist layer, leaves both the holes 25 and the trenches 27 open.

Subsequently, as shown in FIG. 9, a metallic layer 34 is deposited on the side 12. This metallic layer 34 accordingly covers both the mask 17 and the trenches 27 and holes 25. A covering of the side walls 28 and 26 of the trenches 17 and holes 25 is made possible in that the side walls 28 and 26 run inclined due, for example, to the etching process, so that a vaporization or sputtering source for deposition of the layer 34 is not shadowed, or the walls impinged at an angle of incidence in the range of 90°. As a result of the metallization, moreover, also the regions 150 of the trench walls 28 are covered as well, so that the adhesive layer 15 that is laterally exposed in the trenches 27 is covered as well.

Subsequently, the mask 17 is removed and, as a result, also the regions of the metal layer 34 that the mask covers are exposed and removed. The result is shown in FIG. 10. On account of the lateral structure of the mask 17, a metallic layer 34 is now selectively deposited in the trenches 27 and holes 25. The metallic layer 34 covers, in particular, also the bottom of the holes 25, which are formed by the contact junctions 7 on the first side 11 of the wafer 1. In this way, conducting channels 250 through the substrate 3 of the first wafer 1 are created, which run transversely to the adhesively connected side 11 of the wafer 1, in particular perpendicular to the adhesively connected side of the wafer 1, and directly abut the contact junction 7 of the semiconductor component.

Alternatively possible, in accordance with the conventional process for producing structured metallic layers, is also a whole-surface metallization and subsequent structuring by application of a mask, such as, for example, a photoresist, and selective removal of the regions of the metallic layer 34 left exposed by the mask.

FIG. 10 shows, in addition, the intermediate product thus obtained after several further processing steps by way of example. The channels 250 are additionally filled with a conducting material 36 in order to be better able to electrically contact the channels 250. Suitable for this purpose, by way of example, is a conducting epoxide. In addition, solder beads 38 were melted onto the channels. In this way, the electronic components that are then separated along the trenches 27 from the wafer composite can then be soldered directly to the conductor substrate, such as, for example, the printed circuit board provided for this purpose.

Finally, illustrated in FIG. 11 is an electronic component 50, such as can be obtained from the intermediate product shown in FIG. 10 by separation along the trenches 27. The components 50 in this case are separated from the wafer composite of the intermediate product according to FIG. 10 preferably using a saw, which is guided along the trenches 27 as close to the center thereof as possible.

In this case, as can be seen on the basis of FIG. 11, an already fully encapsulated component 50 is obtained then, so that further encapsulation steps can be dispensed with. In particular, the substrate 3 of the semiconductor component is also completely encapsulated with inorganic material or surrounded by inorganic material in this case. The front-side encapsulation in this case is effected by a glass substrate 130 originating from the wafer 13 during separation. The back-side encapsulation takes place by the passivating layer 32. In particular, however, also the adhesive of the adhesive layer 15 is laterally covered by the metallic layer 34 at the transition between the substrates 3 and 130, so that the entry of moisture or oxygen is prevented laterally along the adhesive later 15 or at least strongly reduced.

A variant of the process steps according to FIGS. 8 to 11 will be described below on the basis of FIGS. 12 and 13. FIG. 12 shows a wafer composite with the adhesively connected wafers 1 and 13, which was produced in accordance with the process steps described on the basis of FIGS. 1 to 7. Moreover, as in the case of FIG. 8, a passivating layer 32 was produced on the side 12 of the wafer as well as in the trenches 27 and holes 25. In addition, on the side 12 of the first wafer 1, metallic contact surfaces 42 were produced. Similarly to what was described on the basis of FIGS. 8 to 10, a structured metallic layer 34 was deposited. In the case of the embodiment example shown in FIG. 12, additionally leads 40, together with the metallic layer 34, are defined on the side 12 and electrically connect the conducting channels 250, obtained by the metallization of the holes 25, and thus the contact junctions 7 to the contact surfaces 42. Accordingly, by way of the leads 40, a rearrangement of the back-side connections is effected. This is advantageous, for example, in order to better distribute the contact junctions on the back side when, for instance, a large number of contacts are to be produced and/or the parts 30, or the electronic components, are relatively small.

In order to insulate the leads 40 and the conducting channels 25 in the holes toward the bottom side, a dielectric insulating layer 45 is deposited subsequently on the second side 12 of the first wafer 1 and simultaneously covers also the trenches 27 and, in particular, the adhesive layer 15 that is laterally exposed in the trenches, as shown in FIG. 13. This layer 45, too, is applied in a structured manner, with the contact surfaces 42 for the electrical contact not being covered. The dielectric insulating layer 45 can be produced, for example, by vacuum evaporation of a glass layer, preferably by means of electron-beam evaporation of a glass target.

In order to prepare the intermediate product for the later division in such a way that electronic components that are already in finished encapsulated form can be obtained with the separation from the wafer composite, it is possible to apply in addition, just as described in the example shown in FIG. 10, solder beads 36 to the contact surfaces 42.

Illustrated in FIG. 14 is an electronic component 50, such as is obtained by separation, in particular sawing, along the trenches 27 of the intermediate product shown in FIG. 13. In this embodiment example, too, just as for the electronic component 50 shown in FIG. 11, the substrate 3 containing the semiconductor circuit 5 is completely surrounded by inorganic material for encapsulation. In particular, the adhesive layer 15 between the substrates 1 and 130 of the dielectric layer 45, as is the side 12 of the substrate 3, is covered, so that no damaging atmospheric components can penetrate even laterally along the plastic layer of the adhesive.

FIG. 15 shows a further development of the embodiment example shown in FIG. 13. In this further development, special advantages ensue through the lateral covering of the adhesive layer 15 by an inorganic coating. In contrast to the preceding examples, the first wafer 1 here is adhesively connected to a composite consisting of two wafers 13 and 14. The wafer 14, adhesively connected to the first wafer 1, has recesses 16 here. The connection with the wafer 13 and the active side 11 of the first wafer results in the creation of closed cavities 18, which are bounded by the active side 11 of the first wafer, in particular the regions containing the circuits 5 of this wafer 1. The wafer 13, adhesively connected to the wafer 14, has here, by way of example, additional optical elements 132 in the form of lenses. The wafer 14 serves here as a spacer in order to adjust the spacing between the lenses 132 and the circuit to the focal depth of the lenses. The adhesive layer 15 is here structured, moreover, in such a way that it does not cover the circuits 5 or at least their optically active elements. Here, the covering of the adhesive layer in the trenches 27 prevents moisture from entering laterally through the adhesive layer 15 into the cavities 18. Here, not only the circuits 5 themselves, but also the optical properties of the arrangement, could be interfered with by condensed moisture in a very detrimental manner.

Figure 16:
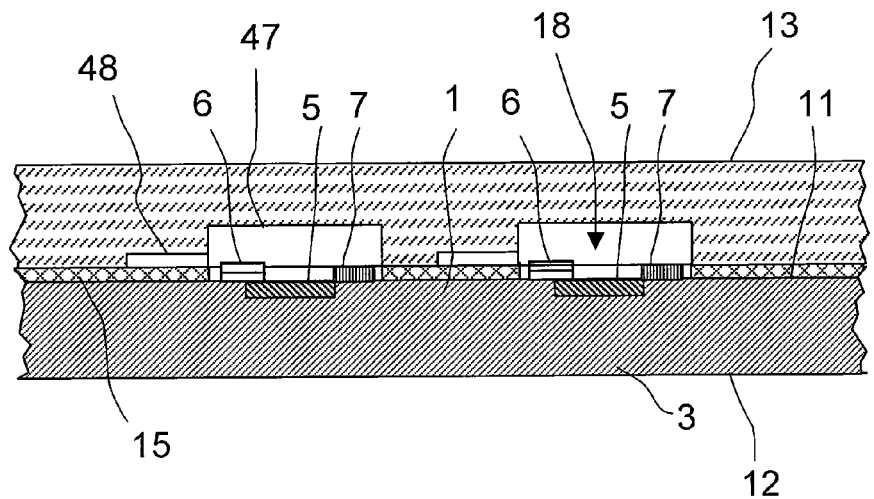

Illustrated in the following, on the basis of FIGS. 16 to 21 and schematic views, are process steps in which a first wafer is connected with a second wafer, with at least one of the wafers having a plurality of electronic, optoelectronic, and/or micro-electromechanical components and with cavities being created during the connection of the two wafers, which surround the components at least partially and communicate via gas-conducting channels with the surrounding. The gas-conducting channels are then closed by application of a coating. In this embodiment example, the gas-conducting channels extend, in particular, along the connecting region and open laterally into the trenches. Similarly to the process described on the basis of FIGS. 1 to 10, the connecting region is then covered laterally in the trenches, whereby, simultaneously, the channels are closed. To this end, FIG. 16 shows a composite consisting of a first wafer 1 and a second wafer 13. In this embodiment example, the wafer 1 has, in addition to semiconductor circuits 5, also micro-electromechanical elements 6. The second wafer 13 is structured on the side with which it is connected to the first wafer 1. In particular, in this case, the wafer 13 has depressions 47 and 48. The depressions 47 form here, in the composite with the first wafer 1, cavities, or empty spaces 18, which surround the semiconductor circuits 5 and the micro-electromechanical elements 6. The longitudinally extending, flute- or groove-like depressions 48 extend along the connecting region with the adhesive layer 15 and adjoin the depressions 47.

Figure 17:
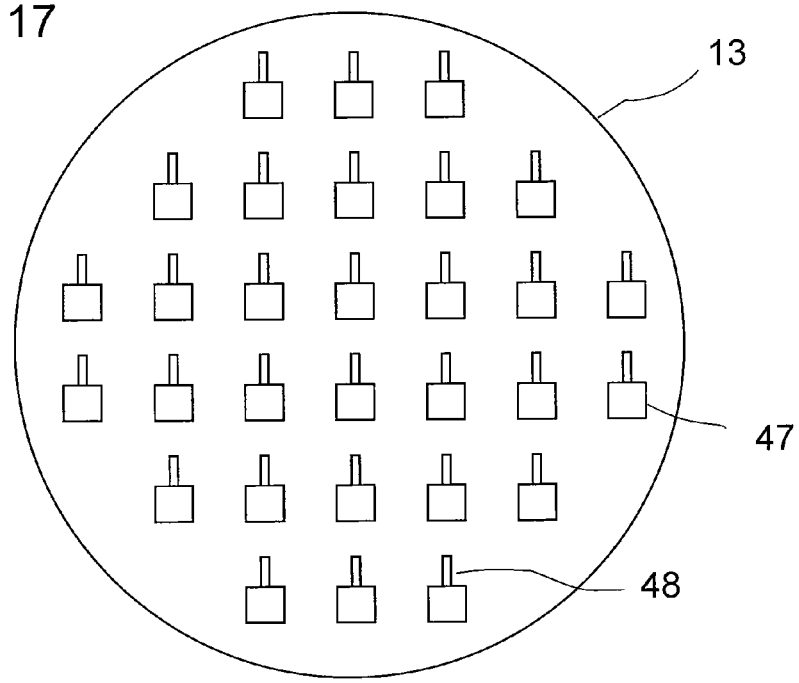
Figure 18:
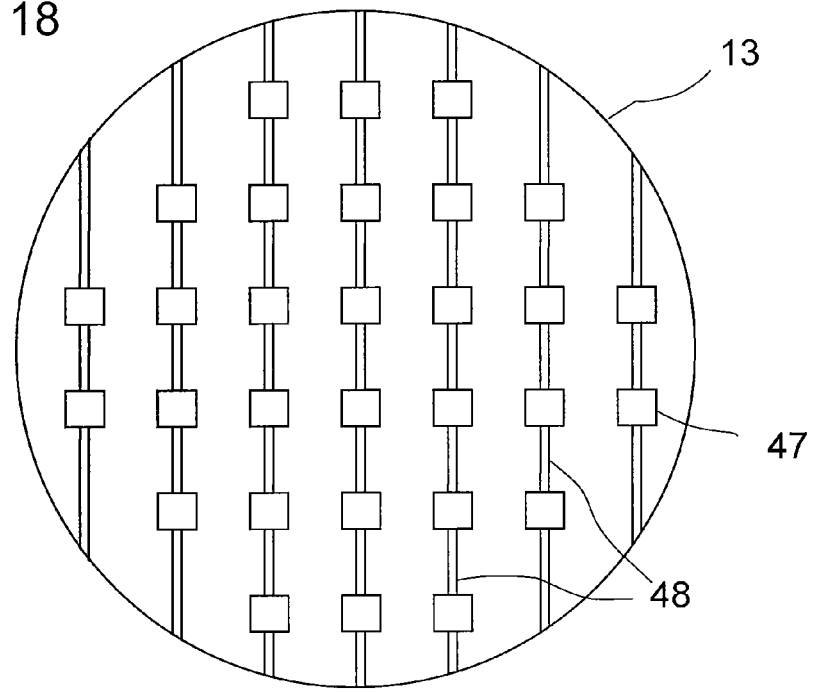

FIG. 17 shows, for clarification, a view on the side of the second wafer 13, which is connected to the first wafer 1. The depressions 48 each end before a neighboring depression 47 in the example shown in this illustration. Likewise, the depressions 48 can, in contrast to what is shown in FIG. 17, each connect depressions 47 and form a raster of linear depressions extending over the wafer surface, as is shown in the variant according to FIG. 18.

Figure 19:
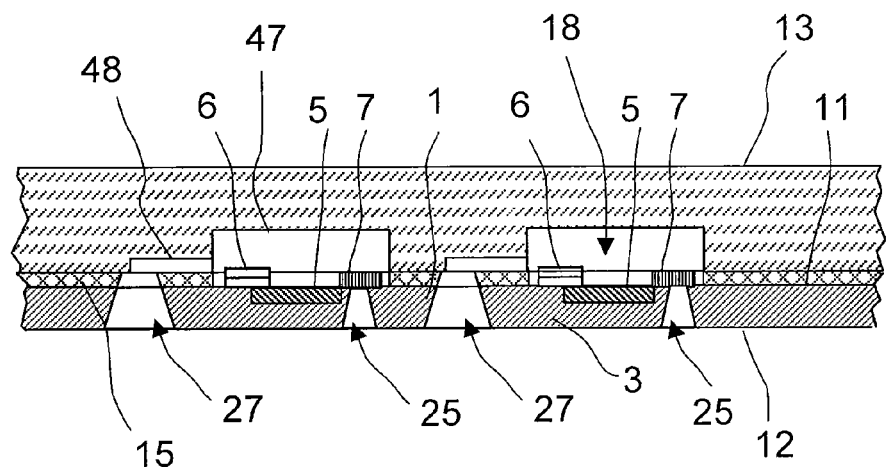

FIG. 19 shows the wafer composite with the wafers 1 and 13 after thinning of the wafer 1 and the making of holes 25 for contacting of the contact junctions 7 and the trenches 27. Similarly to the embodiment example shown in FIG. 7, the adhesive layer 15 is removed in the bottom region of the trenches 27. The trenches 27 are made in such a manner that they abut the depressions 48. These longitudinally extending depressions 48 now form gas-conducting channels, which communicate with the surrounding via the trenches 27 that have been made in order to make possible a gas exchange from the surrounding from and into the cavities formed by the depressions 47.

Illustrated in FIG. 20 is the wafer composite after further processing, as can be done similarly to the embodiment example of FIG. 12. A passivating and/or insulating layer 32 was deposited on the thinned side 12 of the first wafer 1. In addition, a structured metallic layer 34 was applied to the walls of the holes 25 on this side. The regions of the metallic layer also extend in part along the side 12 and form metallic contact junctions on the side 12, which are connected in an electrically conducting manner by means of the layer 3 with the contact junctions 7 on the side 11 of the wafer 1. Both the application of the passivating and/or insulating layer 32 and the metallization to produce the structured metallic layer 34 are preferably vacuum deposition processes. For example, the passivating layer 34 can be produced by means of plasma-assisted chemical vapor-phase deposition and the metallic layer 34 by vacuum evaporation or sputtering. In this process, there ensues the particular advantage that, even in vacuum, no pressure difference can build up between the cavities and the surrounding, because the gas enclosed in the cavities can escape through the channels formed by the depressions 48 into the trenches during evacuation of the surrounding of the wafer composite.

After conclusion of the vacuum coating steps, it is then possible, as illustrated in FIG. 21, to apply selectively a coating 46, which covers and seals both the adhesive layer 15 exposed laterally in the trenches 27 and the openings of the channels, formed by the depressions 48, to the cavities. To this end, by way of example, an appropriate plastic can be used, with preferably a plastic having a high barrier effect compared to the plastic of the adhesive layer 15 being used. If, for example, epoxide resin is used as adhesive, plastics such as polyimide or BCB can be employed for covering as materials of the selectively applied layer 46. In this case, the application of the coating material can take place in a protective-gas atmosphere, which is then also enclosed in the cavities.

It is then possible for still further process steps for the packing of wafer surfaces to follow, such as, for instance, the application of an insulating layer 45 to the side 12 and of solder beads 36 to the regions of the metallic layer 34 exposed by the insulating layer 45, as also shown by way of example in FIG. 21.

FIG. 22 shows a variant of the embodiment example of a wafer composite intermediate product for producing electronic, optoelectronic, or micro-electromechanical components illustrated in FIG. 21. In this variant, the connecting channels do not run along the connecting region of the two wafers 1, 13 and open into trenches 27 that have been made, but rather channels 29 are made through the substrate 3 of the wafer 1 and run transversely to the connecting surface region and connect the cavities with the surrounding, with the channels 29 being covered selectively with a coating and thereby being sealed. The channels 29 can, for example, be made together with the holes 25 for contacting the components and the trenches 27. In the example shown in FIG. 22, an insulating layer is applied for covering the adhesive layer 15 and for closure 25 and, simultaneously, also electrically insulates the side 12, in particular also the metallic layer 34, toward the outside.

In the method according to the invention, as described in the preceding examples, the steps of connecting the two wafers and making the trenches need not necessarily be carried out in this sequence in succession. Instead, the separation of the parts can also take place prior to the connection of the two wafers. For this purpose, it is possible to use an auxiliary substrate on which one wafer is fixed in place. This wafer is then separated into a plurality of parts by making trenches, which are connected to one another by means of the auxiliary substrate. The wafer, separated in parts in this manner and fixed in place on the auxiliary substrate, is then connected to a further wafer, so that, once again, a wafer composite is obtained, in which the first wafer is separated by way of trenches into a plurality of parts, which are fixed in place on the further wafer and are also connected to one another once again by means of the latter. After the fixing in place to each other of the first and second wafer, the auxiliary substrate can be removed once again. Furthermore, the trenches can also be made in the wafers that are connected to the wafer containing the semiconductor circuits.

Figure 23:
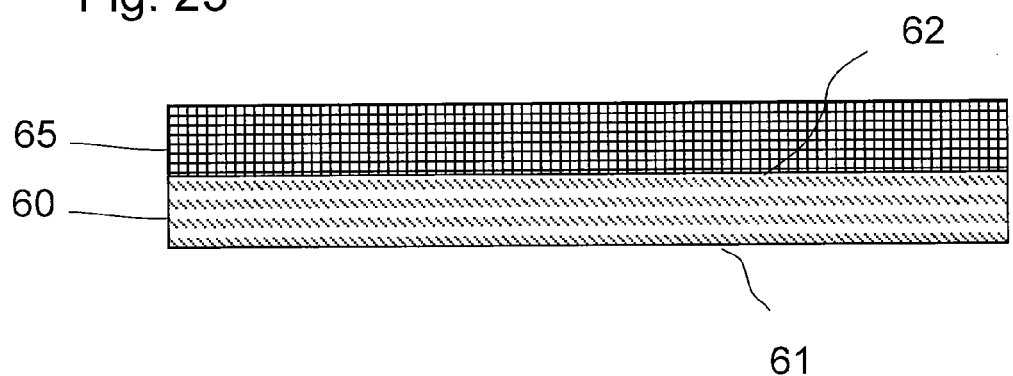

Described in more detail in FIGS. 23 to 26 is an embodiment example according to this embodiment of the invention. Initially, as illustrated in FIG. 23, a first wafer 60, having sides 61, 62, is fixed in place with the side 62 on an auxiliary substrate 65. In this case, the fixing in place is reversible, so that the auxiliary substrate 65 can later be removed. Suitable to this end is a suitable adhesive, the adhesive strength of which can be reversed.

Figure 24:
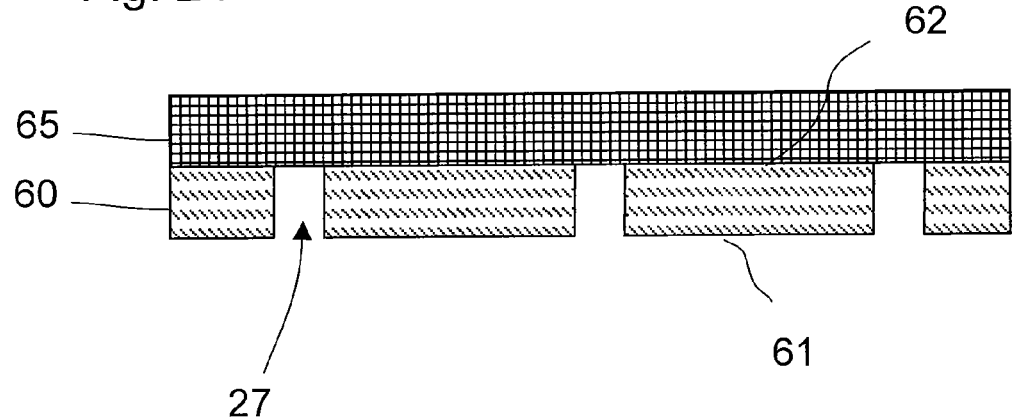

Subsequently, as illustrated in FIG. 24, trenches 27 are made in the side 61, which separate the wafer 60 into a plurality of parts, which are connected, however, by means of the auxiliary substrate. The wafer 60 serves in this example as a covering for the circuits of a semiconductor wafer and can, for example, be a glass wafer, which is particularly suited for the packing of optoelectronic components.

Figure 25:
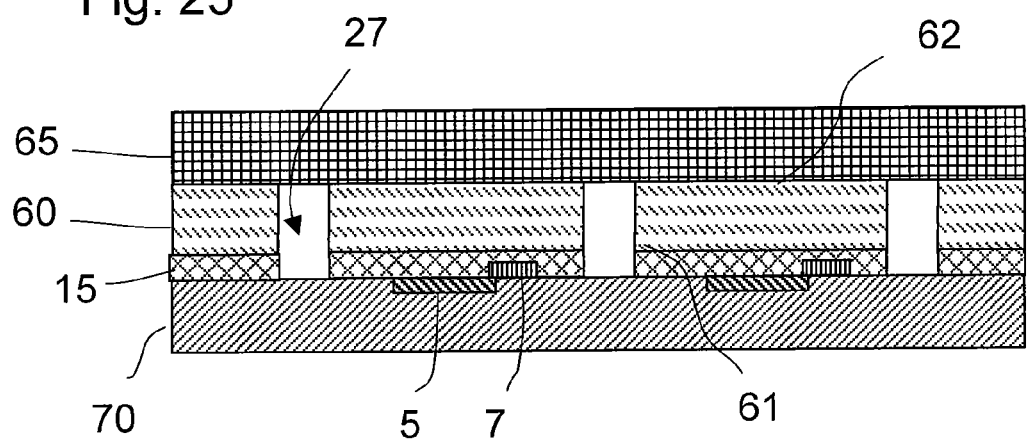
Figure 26:
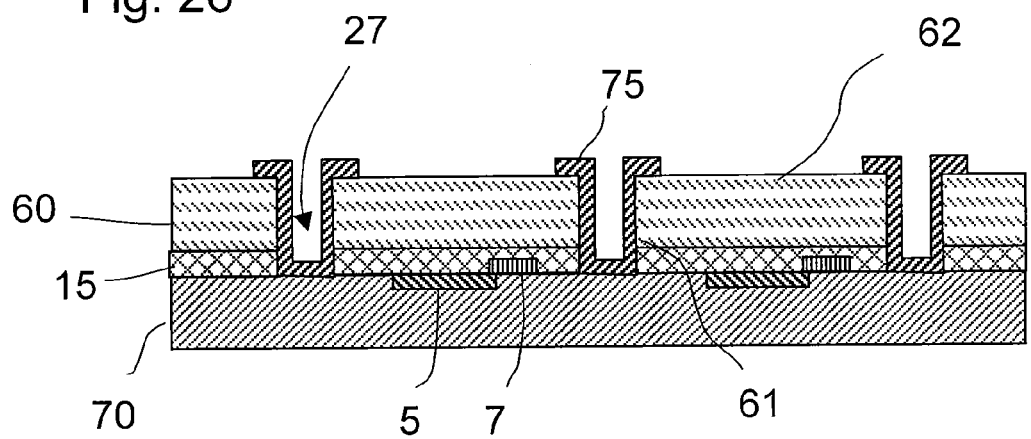

After the trenches 27 have been made, the wafer 60, which is divided into parts and fixed in place on the auxiliary substrate 65, is then connected to a second wafer 70 by means of an adhesive layer 15 to, so that the semiconductor circuits 5 are covered (FIG. 25).

The auxiliary substrate 65 is subsequently removed, so that a wafer composite is obtained, in which the wafer 60 is divided into parts, which are separated from one another by the trenches 27, but connected to one another by means of the semiconductor wafer 70. The adhesive layer 115, which is laterally exposed in the trenches, is then covered laterally by means of a selective coating 57 on the trenches. This processing state is illustrated schematically in FIG. 26. Now, further processing steps can follow, in particular in order to obtain finished components packed in the wafer composite, which are then divided by separating them. Thus, processing steps for the back-side contacting of the circuits by making conducting channels through the substrate of the semiconductor wafer 70 can then follow, for example, once again, which connect the contact junctions on the connecting side to the opposite-lying side.

It is evident to the skilled practitioner that the invention is not limited to the embodiments described above, but rather can be varied in diverse ways. In particular, the features of individual embodiment examples can be combined with one another. Thus, for instance, the two variants according to FIGS. 8 to 10 and FIGS. 12 and 13 can obviously be combined also in diverse ways with each other. Accordingly, the adhesive layer 15 can also be encapsulated, in general, with a multilayer covering, such as, for instance, with a metallic layer and a dielectric layer that is deposited before or after.

The invention claimed is:

1. A method for packing of components on wafer surfaces, comprising:
    connecting a first side of a first wafer to a first side of a second wafer, wherein at least one of the first and second wafers has a plurality of active components on the first side and wherein at least one of the first and second wafers has depressions extending on the first side so that the depressions form channels along a connecting surface region to cavities in the first and/or second wafers, the cavities at least partially surrounding the plurality of active components;
    dividing the first wafer into a plurality of parts by making trenches in a second side of the first wafer opposite to the first side, the plurality of parts being separated from one another by the trenches, but being connected mechanically to one another by the second wafer, wherein the connecting surface region between the first and second wafer is laterally exposed in the trenches so that the channels open laterally into the trenches;
    applying a coating to regions of the trenches in which the connecting surface region is exposed to cover the channels; and
    wherein dividing the first wafer into the plurality of parts by making the trenches takes place prior to connecting the first and second wafers.

2. The method according to claim 1, wherein said plurality of active components comprises semiconductor circuits.

3. The method according to claim 1, further comprising forming the channels through at least one of the first and second wafers so that the channels run transversely to the connecting surface region so that the channels connect the cavity with the surroundings.

4. The method according to claim 1, further comprising fixing the first wafer in place on an auxiliary substrate, then dividing first wafer into the plurality of parts so that the plurality of parts are connected to one another by the auxiliary substrate, and then connecting the first and second wafers.

5. The method according to claim 1, further comprising separating the second wafer along the trenches to produce a plurality of semiconductor components.

\* \* \* \* \*